(12) United States Patent
Hu

(10) Patent No.: US 7,705,471 B2
(45) Date of Patent: *Apr. 27, 2010

(54) CONDUCTIVE BUMP STRUCTURE OF CIRCUIT BOARD AND METHOD FOR FORMING THE SAME

(75) Inventor: Wen-Hung Hu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 147 days.

This patent is subject to a terminal disclaimer.

(21) Appl. No.: 11/412,310

(22) Filed: Apr. 27, 2006

(65) Prior Publication Data

US 2006/0244140 A1    Nov. 2, 2006

(30) Foreign Application Priority Data

Apr. 28, 2005    (TW) .............................. 94113622 A

(51) Int. Cl.
*H01L 23/48* (2006.01)
(52) U.S. Cl. ........................ 257/779; 257/784; 257/786; 174/257
(58) Field of Classification Search ................ 257/779, 257/784, 786; 174/257
See application file for complete search history.

(56) References Cited

U.S. PATENT DOCUMENTS

| 5,192,835 | A | * | 3/1993 | Bull et al. ..................... 174/260 |
| 5,869,899 | A | * | 2/1999 | Arledge et al. .............. 257/738 |
| 6,127,731 | A | * | 10/2000 | Hoffmeyer .................. 257/750 |
| 6,198,169 | B1 | * | 3/2001 | Kobayashi et al. .......... 257/780 |

* cited by examiner

*Primary Examiner*—Cathy Lam
(74) *Attorney, Agent, or Firm*—Sawyer Law Group, P.C.

(57) ABSTRACT

A conductive bump structure of a circuit board and a method for forming the same are proposed. A conductive layer is formed on an insulating layer on the surface of the circuit board. A first resist layer is formed on the conductive layer and a plurality of first openings is formed in the first resist layer to expose the conductive layer. Then, a patterned trace layer is electroplated in the first openings and a second resist layer is covered on the circuit board with the patterned trace layer. Second openings are formed in the second resist layer to expose part of the trace layer to be used as electrical connecting pads. Thereafter, metal bumps are electroplated in the second openings and the surface of the circuit board is covered with a solder mask. A thinning process is applied to the solder mask to expose the top surface of the metal bumps. Afterwards, an adhesive layer is formed on the surface of the metal bumps exposing out of the solder mask.

11 Claims, 8 Drawing Sheets

CONDUCTIVE BUMP STRUCTURE OF CIRCUIT BOARD AND METHOD FOR FORMING THE SAME

FIELD OF THE INVENTION

The present invention relates to a structure and method of electrical terminals, and more particularly, to a conductive bump structure formed on electrical connecting pads of a circuit board and a method for forming the same.

BACKGROUND OF THE INVENTION

Compared to wire bonding technique, flip-chip package technique introduced by IBM Inc. in early 1960 allows semiconductor chips and chip carriers to be electrical connected via solder bumps rather than gold wires, which enhances package density and lowers package size. Meanwhile, this flip-chip technique does not require the longer-length gold wires, thus improving electrical performance.

In current flip-chip technique, electrode pads are disposed on an electrical surface with a surface mounted device such as an semiconductor Integrated Circuit (IC) chip, and corresponding contact solder pads are formed on an organic circuit board, so as to dispose solder bumps or other conductive adhesive materials between the semiconductor chip and circuit board, allowing the chip to be situated on the circuit board with its electrical contact surface facing downward. The solder bumps or conductive adhesive materials provide electrical Input/Output (I/O) and mechanical connection between the chip and the circuit board. A method of forming conductive bumps on a circuit board via electroplating is described below in conjunction with the drawings.

FIGS. 1A to 1H are cross-sectional schematic diagrams depicting a structure corresponding to a traditional method of forming conductive bumps on a circuit board. As shown, a first conductive layer 12 (as shown in FIG. 1A) is formed on an insulating layer 11 of a surface of the circuit board; then a first resist layer 13 is formed (as shown in FIG. 1B) on the first conductive layer 12; a plurality of openings 130 are then formed on the first resist layer 13 to expose the first conductive layer 12; electroplating is performed thereafter so as to form electrical connecting pads 140 (as shown in FIG. 1C) on the first conductive layer 12 within the first openings 130; then the first resist layer 13 is stripped away and etching is performed to remove part of the first conductive layer 12 that was covered by the first resist layer 13 (as shown in FIG. 1D).

The above-described steps that allow electrical connecting pads 140 to be formed on a surface of the circuit board complete a required first stage of the whole process. Thereafter, a solder mask 15 is formed on the circuit board formed with electrical connecting pads 140 in order to protect the circuit board from environmental pollution and/or damage. Then, a plurality of second openings 150 can be formed on the solder mask 15 via steps such as exposure and development, such that the electrical connecting pads 140 are exposed through the second openings 150 of the solder mask 15 (as shown in FIG. 1E). Furthermore, a second conductive layer 16 is formed on the solder mask 15 and its second openings 150 as electrical current conductive path for the subsequent electroplating process. A second resist layer 17 is formed on the second conductive layer 16 and a plurality of third openings 170 are formed on the second resist layer 17 to expose part of the second conductive layer 16 (as shown in FIG. 1F). Thereafter, electroplating is performed again, so as to form solder materials 18 on the second conductive layer 16 within the third openings 170 (as shown in FIG. 1G). The second resist layer 17 is then stripped away and etching is performed to remove the second conductive layer 16 that was covered by the second resist layer 17, such that reflow is performed on the solder materials 18 to form solder bumps (not shown).

As can be seen from the above steps, the solder mask and the second resist layer respectively gone through exposure and development during patterning in order to form the second openings and the third openings, thereby forming conductive bumps within the third openings. Since that patterning (exposure and development etc.) are performed twice to form the second openings and the third openings, the size of the third openings are limited by that of the second openings. As a result, the pitch between the conductive bumps cannot be minimized, that is, the size of the openings of the solder mask (solder proof layer) and of the second resist layer (electroplating-resist layer) is mainly formed via exposure and development. Moreover, fine alignment is required, but the alignment precision of a standard machine is approximately 20 µm-30 µm, thus the openings of the second resist layer cannot be easily aligned to the center of the openings of the solder mask. Thus, the size of the openings is forced to be enlarged to reduce alignment difficulty and precision. Enlarging the size of the openings of the second resist layer compromises the fine pitch requirement of the electrical connecting pads. Thus, the electroplating process is not able to effectively form fine pitched conductive bumps on the electrical connecting pads. If fine pitched conductive bumps are required, then the alignment precision of the solder mask and the resist layer must be increased, this complicates the process, increases the time required as well as the alignment difficulty.

Furthermore, since solder materials are directly formed on the electrical connecting pads in the openings of the solder mask, the height of the solder materials on the electrical connecting pads are not easily controlled to be uniform, affecting the subsequent process reliability when the circuit board is electrically connected to external electronic components.

SUMMARY OF THE INVENTION

In the light of forgoing drawbacks, an objective of the present invention is to provide a conductive bump structure of a circuit board and the method for forming the same, wherein only a single patterning process (i.e. exposure and development etc.) is applied to the circuit board surface with a plurality of electrical connecting pads formed thereon so as to form openings, and conductive bumps of the circuit board are subsequently formed by electroplating, solving the problems of limited pitch reduction due to two exposures. Additionally, the fabrication cost is reduced due to reduction in the number of exposures required.

Another objective of the present invention is to provide a conductive bump structure of a circuit board and the method for forming the same with more uniform conductive bumps.

In accordance with the above and other objectives, the present invention discloses a method for forming a conductive bump structure of a circuit board, comprising: providing a circuit board covered with a conductive layer on an insulating layer thereof; forming a first resist layer on the conductive layer and a plurality of first openings on the first resist layer to expose a part of the conductive layer; electroplating to form a patterned trace layer within the first openings; overlying a second resist layer on a surface of the circuit board with the patterned trace layer and forming a plurality of second openings on the second resist layer to expose a part of the circuit layer as electrical connecting pads; electroplating to form metal bumps in the second openings and removing the second resist layer, the first resist layer and the underlying conductive layer; forming an organic insulating protective layer on the surface of the circuit board so as to cover the metal bumps; thinning the organic insulating protective layer so as to expose the top surface of the metal bumps; and forming an adhesive layer on the surface of the metal bumps exposed from the organic insulating protective layer.

The present invention also discloses a conductive bump structure of a circuit board, comprising metal bumps formed on electrical connecting pads on the circuit board and an adhesive layer covering a portion of the metal bumps that is exposed out of the organic insulating protective layer.

Compared to the prior art where two patterning processs (exposure and development) are required to form conductive bumps of a circuit board, the present invention discloses the structure of conductive bumps of a circuit board and the method for forming the same using only a single patterning process, in which after a first patterned resist layer is formed and the patterned trace layer is formed, a second patterned resist layer is formed on the circuit board with the patterned trace layer, such that openings of the second patterned resist layer expose the patterned trace layer, so metal bumps can be subsequently formed by electroplating on the surface of electrical connecting pads within the openings of the second resist layer. This is unlike the prior art where a first patterned resist layer, a solder mask and a second patterned resist layer have to be formed, in addition, another conductive layer is used to form the conductive bumps of the circuit board. The method of the present invention simplifies the manufacturing process, as well as solving the problem of limited pitch reduction of the conductive bumps due to two exposures.

Moreover, in the present invention, the second patterned resist layer is formed on the circuit board after the patterned trace layer is formed, so that the patterned trace layer is exposed from the openings of the second patterned resist layer and subsequently metal bumps are formed on the surface of the electrical connecting pads in the second resist layer, then the solder mask is formed and the thinning process is applied to expose part of the metal bumps, thereafter, the adhesive layer is formed on the exposed surface of the metal bumps. This is unlike the prior art where the first patterned resist layer, the solder mask and the second patterned resist layer have to be formed and another conductive layer is used to form the solder material. The conductive bumps of the present invention are therefore more uniform, which is advantageous in combining with metal bumps of a chip.

Therefore, the present invention uses a conductive layer and patterned first and second resist layers to sequentially electroplate and form electrical connecting pads and metal bumps on the electrical connecting pads. Thereafter, the second and first resist layers and the underlying conductive layer are removed and then an insulating protective layer is covered on the circuit board and undergone a thinning process to expose part of the metal bumps. An Adhesive layer is then formed on the exposed metal bumps. As a result, the patterning process (e.g. exposure and development) for the insulating protective layer can be reduced to avoid the high alignment precision requirement when forming metal bumps on electrical connecting pads in the prior rat. Accordingly, the present invention is able to provide a finer pitch between the metal bumps. Furthermore, the present invention avoids directly electroplating and forming solder materials in the openings of the insulating protective layer and the resist layer, so the resulting height of the solder materials can be controlled to be uniform, facilitating better connectivity of the circuit board with external electronic components.

BRIEF DESCRIPTION OF THE DRAWINGS

The present invention can be more fully understood by reading the following detailed description of the preferred embodiments, with reference made to the accompanying drawings, wherein:

FIGS. 3G' to 3I' are cross-sectional schematic diagrams depicting a method of forming a fourth embodiment of the conductive bump structure of a circuit board of the present invention.

DETAILED DESCRIPTION OF THE EMBODIMENTS

The present invention relates to a structure and method of electrical terminals, and more particularly, to a conductive bump structure formed on electrical connecting pads of a circuit board and a method for forming the same. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

FIGS. 2A to 2H are cross-sectional schematic diagrams depicting a method of forming a first embodiment of the conductive bumps of a circuit board of the present invention.

Figure 1A:
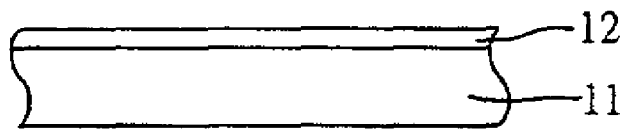
FIGS. 1A to 1H (PRIOR ART) are cross-sectional schematic diagrams depicting a structure corresponding to a traditional method of forming conductive bumps on a circuit board.
Figure 1B:
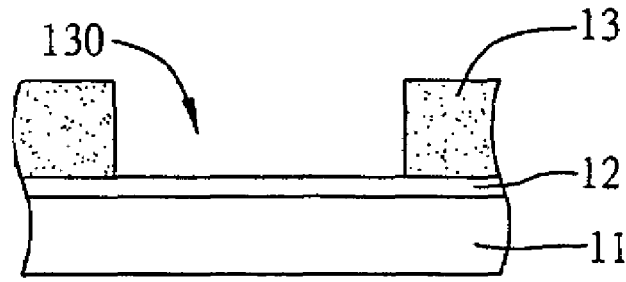
Figure 1C:
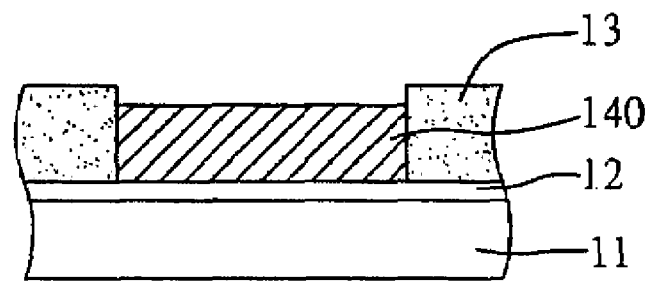
Figure 1D:
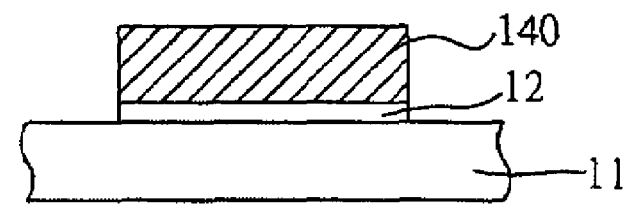
Figure 1E:
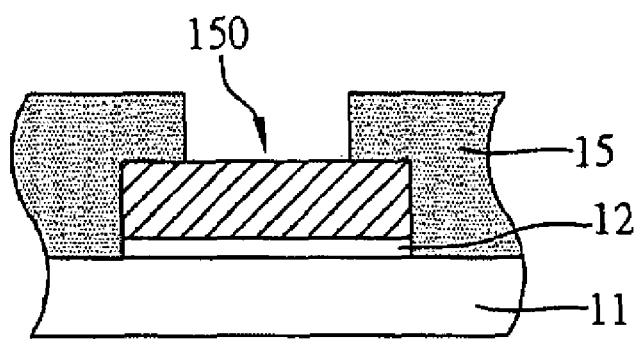
Figure 1F:
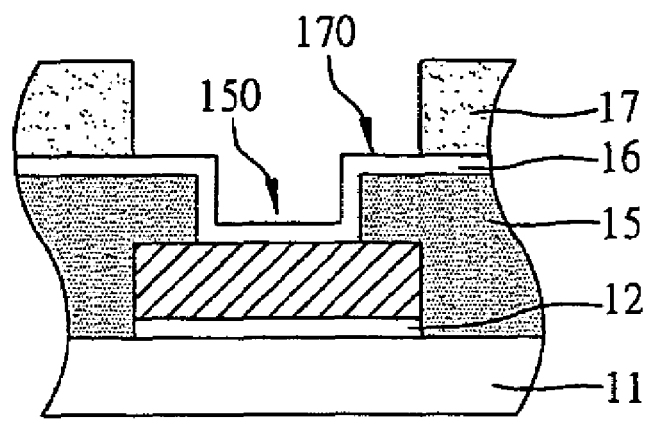
Figure 1G:
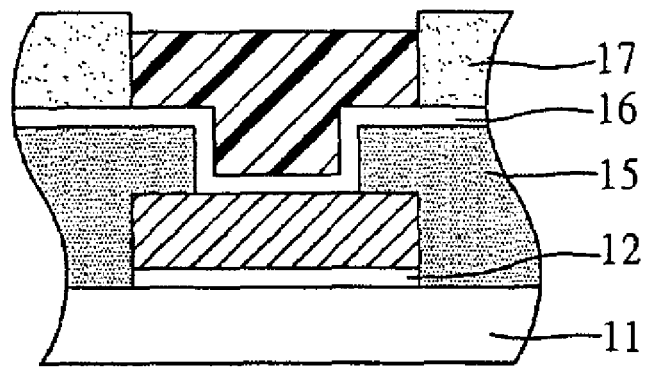
Figure 1H:
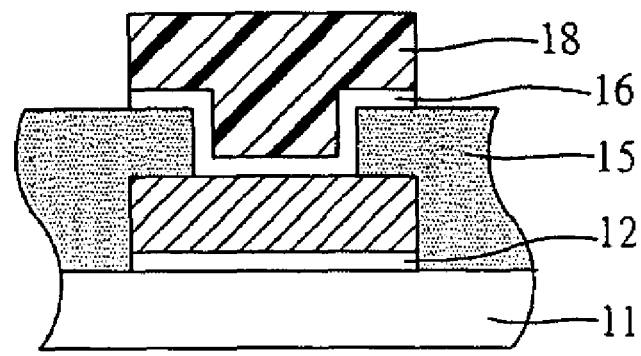
Figure 2A:
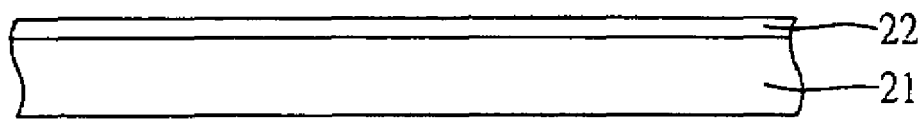
FIGS. 2A to 2H are cross-sectional schematic diagrams depicting a method of forming a first embodiment of the conductive bump structure of a circuit board of the present invention.

As shown in FIG. 2A, a circuit board with a single inner circuit or multiple inner circuits is first provided. A conductive layer 22 is then formed on an insulating layer 21 on a surface of the circuit board. The insulating layer 21 can be made of materials such as epoxy resin, polyimide, cyanate ester, glass fiber, Bismaleimide Triazine (BT), FR5 etc. The conductive layer 22 primarily acts as the electrical current conductive path required for electroplating metal layers (including patterned circuit structure and metal bumps on electrical connecting pads) in a later stage. The conductive layer 22 can be made of metal, alloy, stacked metal layers or conductive polymer materials.

Figure 2B:
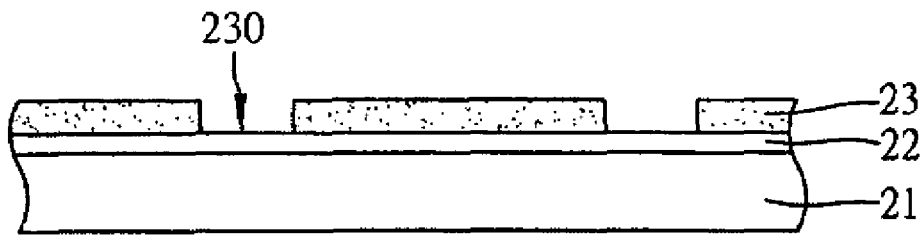

As shown in FIG. 2B, a first resist layer 23 is covered on the conductive layer via printing, spin coating or attaching. The first resist layer 23 is for example a dry or liquid photoresist. The first resist 23 is patterned (e.g. exposure and development etc.) to form a plurality of first openings 230 to expose part of conductive layer 22 to be formed as a patterned trace layer. It should be obvious that if the first resist layer 23 is a non-photosensitive insulating material, then the openings can be formed via conventional techniques such as laser drilling.

Figure 2C:
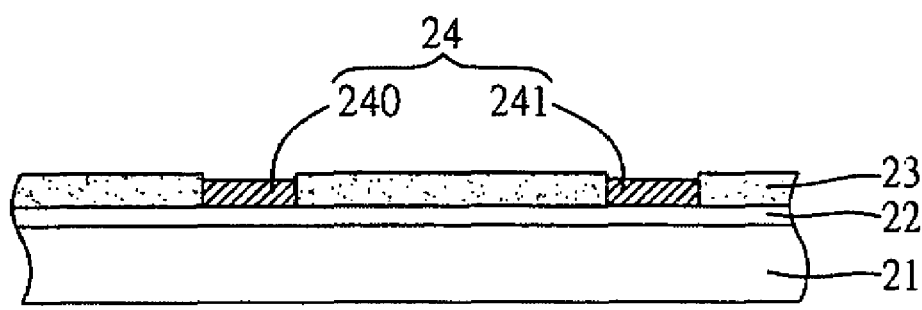

As shown in FIG. 2C, an electroplating process is performed so as to electroplate and form a patterned trace layer 24 on the conductive layer 22 in the first openings 230. The patterned trace layer 24 includes a plurality of electrical connecting pads 240 and conductive circuits 241. The electrical connecting pads 240 are usually the ends of the conductive circuits, or can be coupled to inner circuits (not shown) of circuit board through conductive vias. Additionally, the electrical connecting pads can be disposed on one of a single surface or both the top and bottom surfaces of the circuit board.

Figure 2D:
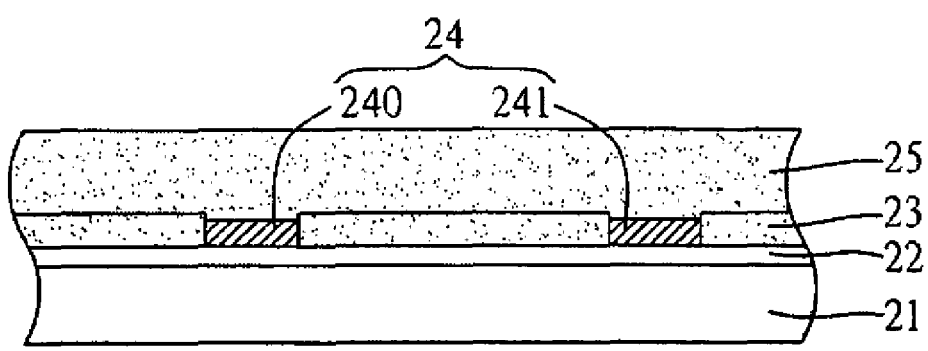
Figure 2E:
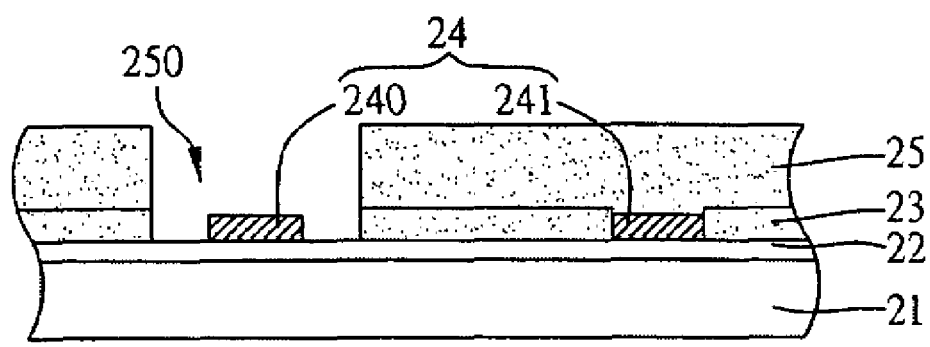
Figure 2F:
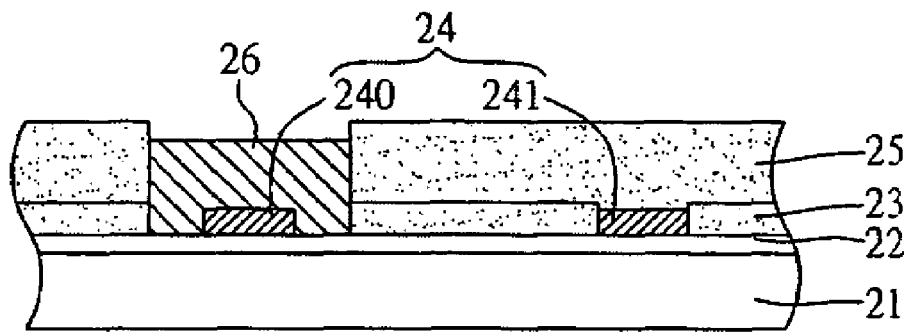

As shown in FIG. 2D, a second resist layer 25 is further covered on the circuit board with the patterned trace layer 24. The material used for the second resist layer 25 may be the same as that of the first resist layer 23. Thereafter, second openings 250 are patterned (exposure, development and laser etc.) to be formed in the second resist layer 25 and the first resist layer 23 in order to expose the electrical connecting pads 240 (as shown in FIG. 2F). The size of the second openings 250 exposing the electrical connecting pads 240 is larger than that of a corresponding electrical connecting pad, such that the electrical connecting pad 240 and part of the conductive layer 22 are exposed from the second opening 250. This reduces the requirement for alignment precision for processes such as exposure and development.

As shown in FIG. 2F, electroplating is performed again using the conductive layer 22 and the electrical connecting pads 240 as the electrical current conductive paths, so as to directly form metal bumps 26 on the top surface and sides of the electrical connecting pads 240 and on the conductive layer 22 in the second openings 250. The material of the metal bumps 26 is one selected from copper, tin, lead, silver and their alloys.

Figure 2G:
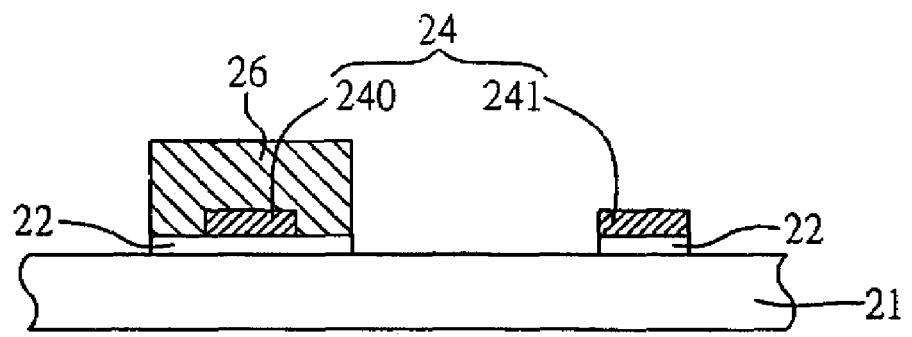

As shown in FIG. 2G, after the metal bumps 26 are formed, the second resist layer 25 and the first resist layer 23 are stripped away and etching is performed to remove the conductive layer 22 that was underneath the resist layers. The stripping can be a wet chemical stripping or physical stripping.

Figure 2H:
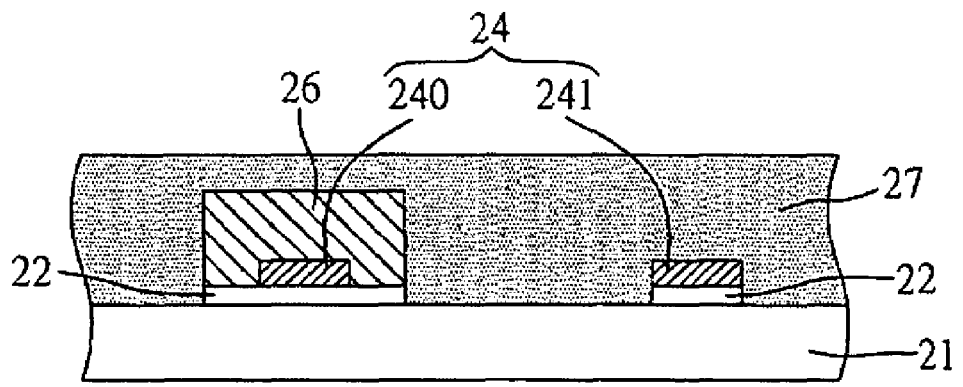

As shown in FIG. 2H, an organic insulating protective layer such as a solder mask 27 is formed on the surface of the circuit board via traditional methods such as printing, spin coating or attaching etc., such that the solder mask 27 completely covers the metal bumps 26. The solder mask 27 can protect the circuit board from external environmental pollution or damage.

Figure 2I:
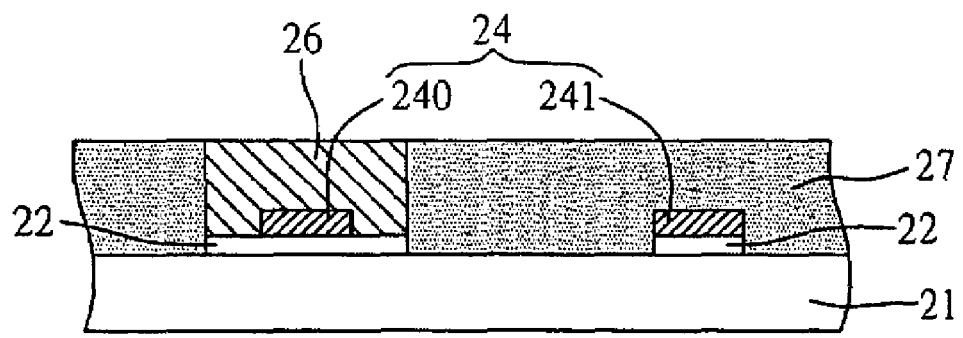
FIGS. 2I to 2J' are cross-sectional schematic diagrams depicting a method of forming a second embodiment of the conductive bump structure of a circuit board of the present invention.

As shown in FIG. 2I, a thinning process is performed on the solder mask 27 until the solder mask 27 is flushed with the metal bumps 26 to completely expose the top surface of the metal bump 26. The thinning process can be achieved via techniques such as abrasion and plasma cleaning to remove part of the solder mask 27.

Figure 2J:
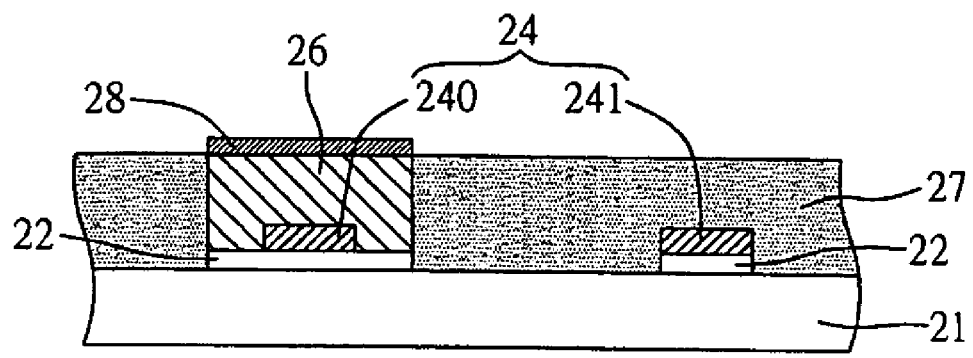
Figure 2H:
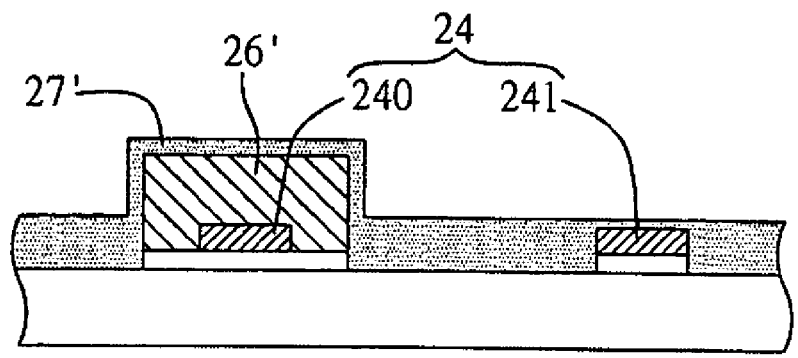
Figure 2I:
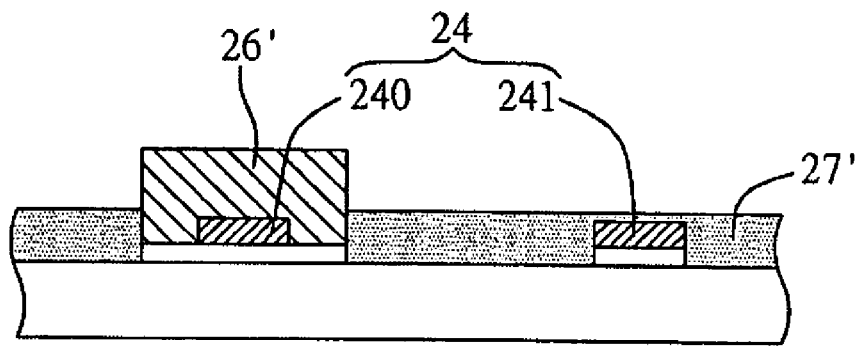
Figure 2J:
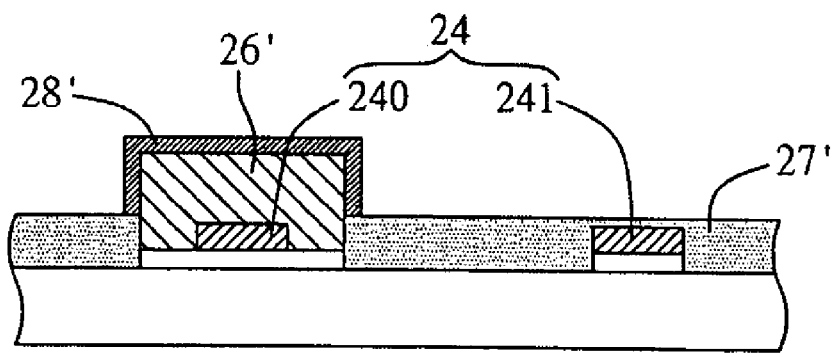

Referring to FIG. 2J, an adhesive layer 28 is formed on the surface of the metal bumps 26 exposed out of the solder mask 27 via techniques such as physical vapor deposition, chemical deposition or electroless plating. The material of the adhesive layer can be one selected from copper, tin, lead, silver, nickel, gold, platinum and their alloys.

FIGS. 2H' to 2J' show cross-section schematic diagrams depicting a method of forming a second embodiment of conductive bump structure of a circuit board of the present invention.

The processes for forming the electrical connecting pads and metal bumps in this embodiment are similar to those in the first embodiment (FIGS. 2A to 2G), thus they are omitted for conciseness.

As shown in FIG. 2H', after the conductive bumps 26' are formed and the second and first resist layers and the conductive layer are removed, a solder mask 27' can be formed on the surface of the circuit board via techniques such as printing, spin coating or attaching, such that the solder mask 27' covers the outer surface of the metal bumps 26'.

As shown in FIG. 2I', the solder mask 27' on the surface of the metal bumps 26' are partially removed such that the top surface and partial sides of the metal bumps 26' are exposed. The partial removal of the solder mask 27' can be achieved via techniques such as plasma cleaning.

Referring to FIG. 2J', an adhesive layer 28' is formed on the top surface and partial sides of the metal bumps 26 exposed out of the solder mask 27 via techniques such as physical vapor deposition, chemical deposition or electroless plating. The material of the adhesive layer can be one selected from copper, tin, lead, silver, nickel, gold, platinum and their alloys.

From the above processes, the present invention discloses a conductive bump structure for a circuit board, which includes: conductive bumps 26 and 26' having a cap structure formed on the electrical connecting pads 240 of the circuit board to cover the top surface and sides of the electrical connecting pads 240; a solder mask 27 and 27' covering the surface of the circuit board, from which the top surface of the metal bumps 26 and 26' are exposed; and an adhesive layer 28 and 28' covering the part of the metal bumps 26 and 26' that are exposed from the solder mask 27 and 27'.

FIGS. 3A to 3I show cross-section schematic diagrams depicting a method of forming a third embodiment of conductive bump structure of a circuit board of the present invention.

Figure 3A:
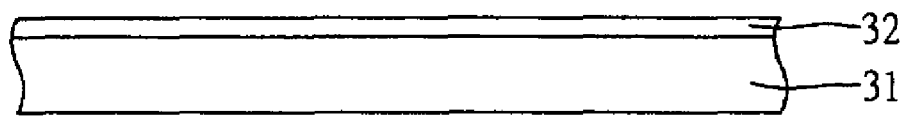
FIGS. 3A to 3I are cross-sectional schematic diagrams depicting a method of forming a third embodiment of the conductive bump structure of a circuit board of the present invention.

As shown in FIG. 3A, a circuit board with a single inner circuit or multiple inner circuits is first provided. A conductive layer 32 is then formed on an insulating layer 31 on a surface of the circuit board. The insulating layer 31 can be made of materials such as epoxy resin, polyimide, cyanate ester, glass fiber, Bismaleimide Triazine (BT), FR5 etc. The conductive layer 32 primarily acts as the electrical current conductive path required for electroplating metal layers (including patterned circuit structure and metal bumps on electrical connecting pads) in a later stage. The conductive layer 22 can be made of metal, alloy, stacked metal layers or conductive polymer materials.

Figure 3B:
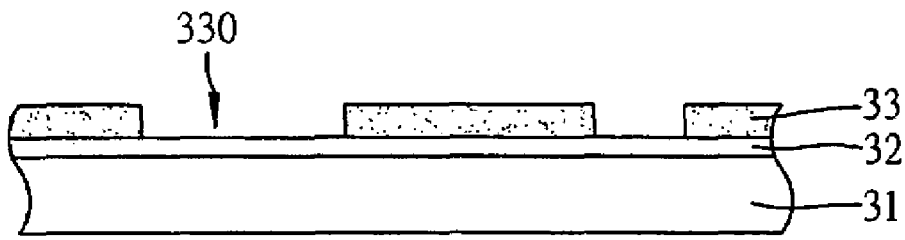

As shown in FIG. 3B, a first resist layer 33 is covered on the conductive layer via printing, spin coating or attaching. The first resist layer 33 is for example a dry or liquid photoresist. The first resist 33 is patterned (e.g. exposure and development etc.) to form a plurality of first openings 330 to expose part of conductive layer 32 to be formed as a patterned trace layer. It should be obvious that if the first resist layer 33 is a non-photosensitive insulating material, then the openings can be formed via conventional techniques such as laser drilling.

Figure 3C:
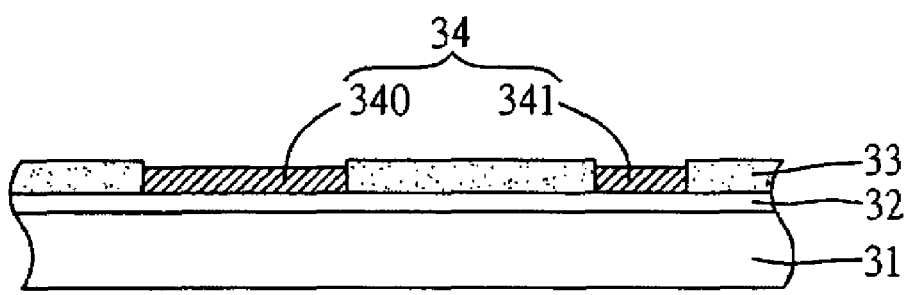

As shown in FIG. 3C, an electroplating process is performed so as to electroplate and form a patterned trace layer 34 on the conductive layer 32 in the first openings 330. The patterned trace layer 34 includes a plurality of electrical connecting pads 340 and conductive circuits 341. The electrical connecting pads 240 are usually the ends of the conductive circuits, or can be coupled to inner circuits (not shown) of circuit board through conductive vias. Additionally, the electrical connecting pads can be disposed on one of a single surface or both the top and bottom surfaces of the circuit board.

Figure 3D:
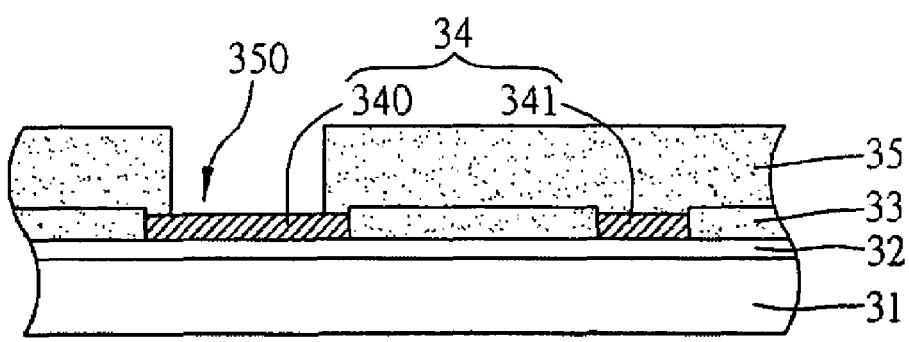

As shown in FIG. 3D, a second resist layer 35 is further covered on the circuit board with the patterned trace layer 34. The material used for the second resist layer 35 may be the same as that of the first resist layer 33. Thereafter, second openings 350 are patterned (exposure, development and laser etc.) to be formed in the second resist layer 25 in order to expose the electrical connecting pads 340. The size of the second openings 350 exposing the electrical connecting pads 340 is smaller than that of a corresponding electrical connecting pad.

Figure 3E:
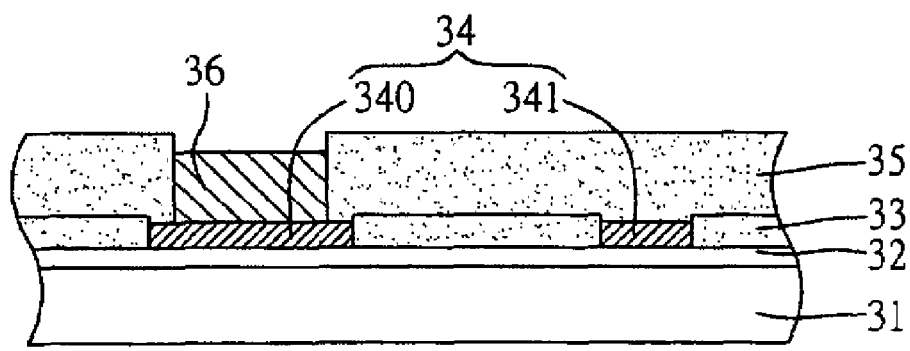

As shown in FIG. 3E, electroplating is performed again using the conductive layer 32 and the electrical connecting pads 340 as the electrical current conductive paths, so as to directly form metal bumps 36 with area smaller than that of the electrical connecting pads 340 on the electrical connecting pads 340 in the second openings 350. The material of the metal bumps 36 can be one selected from copper, tin, lead, silver and their alloys.

Figure 3F:
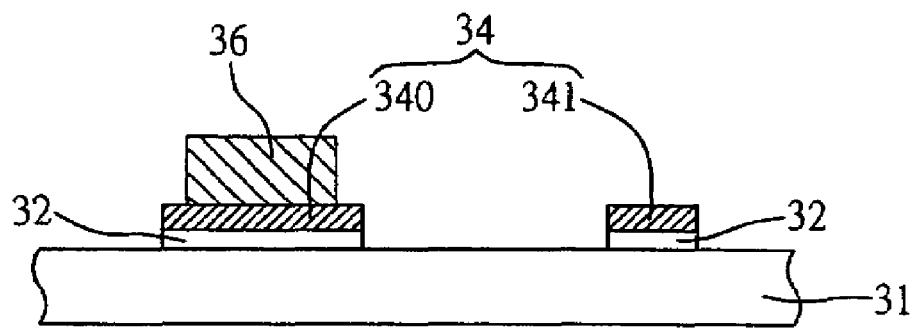

As shown in FIG. 3F, after the metal bumps 36 are formed, the second resist layer 35 and the first resist layer 33 are stripped away and etching is performed to remove the conductive layer 32 that was underneath the resist layers. The stripping can be a chemical stripping.

Figure 3G:
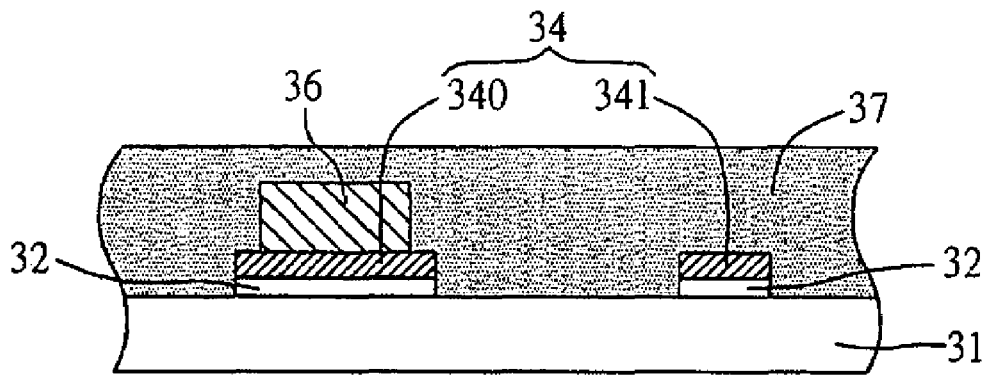

As shown in FIG. 3G, a solder mask 37 is formed on the surface of the circuit board via traditional methods such as printing, spin coating or attaching etc, such that the solder mask 37 completely covers the metal bumps 36. The solder mask 37 can protect the circuit board from external environmental pollution or damage.

Figure 3H:
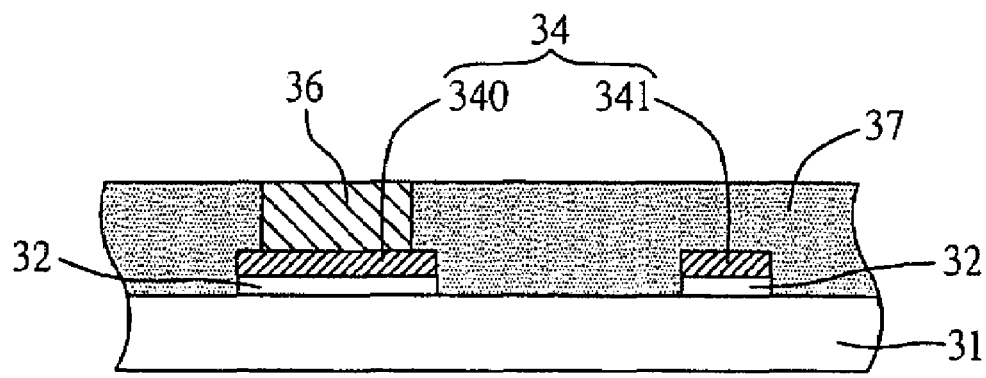

As shown in FIG. 3H, a thinning process is performed on the solder mask 37 until the solder mask 37 is flushed with the metal bumps 36 to completely expose the top surface of the metal bumps 36. The thinning process can be achieved via techniques such as abrasion and plasma cleaning to remove part of the solder mask 27.

Figure 3I:
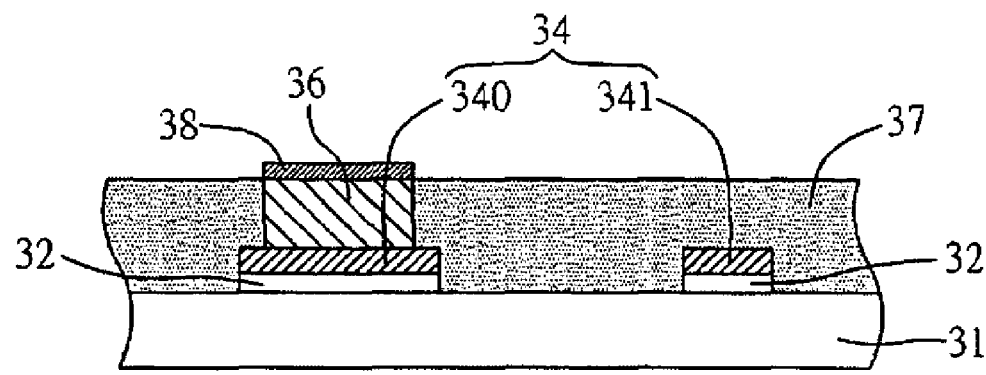
Figure 3G:
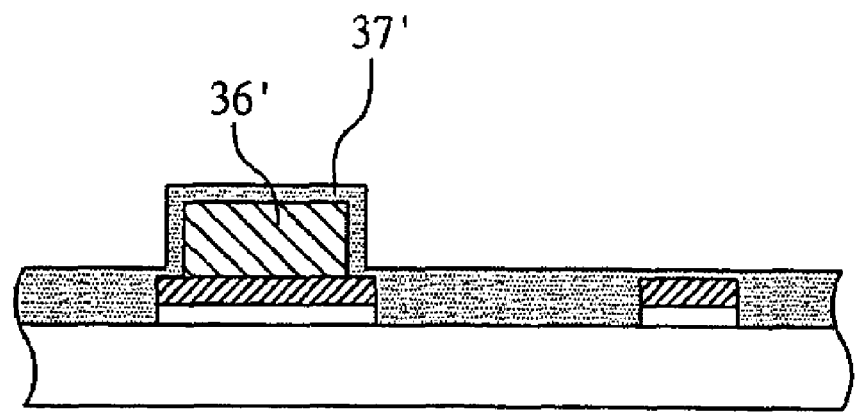
Figure 3H:
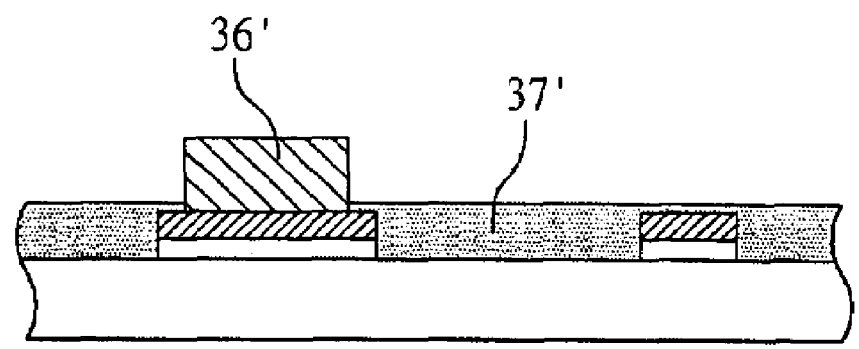
Figure 3I:
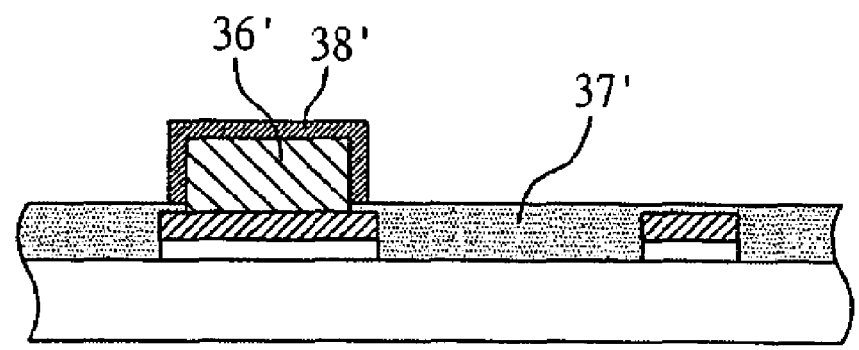

Referring to FIG. 3I, an adhesive layer 38 is formed on the surface of the metal bumps 36 exposed out of the solder mask 37 via techniques such as physical vapor deposition, chemical deposition or electroless plating. The material of the adhesive layer can be one selected from copper, tin, lead, silver, nickel, gold, platinum and their alloys.

FIGS. 3G' to 3I' show cross-section schematic diagrams depicting a method of forming a fourth embodiment of conductive bump structure of a circuit board of the present invention.

The processes for forming the electrical connecting pads and metal bumps in this embodiment are similar to those in the third embodiment (FIGS. 3A to 3F), thus they are omitted for conciseness.

As shown in FIG. 3G', after the conductive bumps 36' are formed and the second and first resist layers and the conductive layer are removed, an organic insulating protective layer such as a solder mask 37' can be formed on the surface of the circuit board via techniques such as printing, spin coating or attaching, such that the solder mask 37' covers the outer surface of the metal bumps 36'.

As shown in FIG. 3H', the solder mask 37' on the surface of the metal bumps 36' are partially removed such that the top surface and partial sides of the metal bumps 36' are exposed. The partial removal of the solder mask 37' can be achieved via techniques such as plasma cleaning.

Referring to FIG. 3I', an adhesive layer 38' is formed on the top surface and partial sides of the metal bumps 36 exposed out of the solder mask 37 via techniques such as physical vapor deposition, chemical deposition or electroless plating. The material of the adhesive layer can be one selected from copper, tin, lead, silver, nickel, gold, platinum and their alloys.

From the above processes, the present invention discloses a conductive bump structure for a circuit board, which includes: conductive bumps 36 and 36' having a bulk structure formed on the electrical connecting pads 340 of the circuit board to cover a part of the top surface of the electrical connecting pads 340; a solder mask 37 and 37' covering the surface of the circuit board, from which the top surface of the metal bumps 36 and 36' are exposed; and an adhesive layer 38 and 38' covering the part of the metal bumps 36 and 36' that are exposed from the solder mask 37 and 37'.

Compared to the prior art where two patterning processes (exposure and development) are required to form conductive bumps of a circuit board, the present invention discloses the structure of conductive bumps of a circuit board and the method for forming the same using only a single patterning process, in which after a first patterned resist layer is formed and the patterned trace layer is formed, a second patterned resist layer is formed on the circuit board with the patterned trace layer, such that openings of the second patterned resist layer expose the patterned trace layer, so metal bumps can be subsequently formed by electroplating on the surface of electrical connecting pads within the openings of the second resist layer. This is unlike the prior art where a first patterned resist layer, a solder mask and a second patterned resist layer have to be formed, in addition, another conductive layer is used to form the conductive bumps of the circuit board. The method of the present invention simplifies the manufacturing process, as well as solving the problem of limited pitch reduction of the conductive bumps due to two exposures. Moreover, in the present invention, the second patterned resist layer is formed on the circuit board after the patterned trace layer is formed, so that the patterned trace layer is exposed from the openings of the second patterned resist layer and subsequently metal bumps are formed on the surface of the electrical connecting pads in the second resist layer, then the solder mask is formed and the thinning process is applied to expose part of the metal bumps, thereafter, the adhesive layer is formed on the exposed surface of the metal bumps. This is unlike the prior art where the first patterned resist layer, the solder mask and the second patterned resist layer have to be formed and another conductive layer is used to form the solder material. The conductive bumps of the present invention are therefore more uniform, which is advantageous in combining with metal bumps of a chip.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A conductive bump structure of a circuit board, comprising:

metal bumps having a cap structure formed on electrical connecting pads on the circuit board to completely cover the top surface and the sides of the electrical connecting pads, wherein the metal bumps and electrical connecting pads are disposed on a conductive layer, the surface of the circuit board is covered with an organic insulating protective layer, and the top surface of the metal bumps is exposed out of the organic insulating protective layer; and an adhesive layer covering a portion of the metal bumps that is exposed out of the organic insulating protective layer.

2. The conductive bump structure of a circuit board of claim 1, wherein the adhesive layer is formed on the top surface of the metal bumps.

3. The conductive bump structure of a circuit board of claim 1, wherein the adhesive layer is formed on the top surface and the sides of the metal bumps.

4. The conductive bump structure of a circuit board of claim 1, wherein the metal bumps are selected from at least one of copper, tin, silver, lead and their alloys.

5. The conductive bump structure of a circuit board of claim 1, wherein the adhesive layer is one selected from copper, tin, lead, silver, nickel, gold, platinum and their alloys.

6. A conductive bump structure of a circuit board, comprising:

metal bumps having a bulky structure formed on electrical connecting pads on the circuit board to cover a portion of the top surface of the electrical connecting pads, wherein the electrical connecting pads are disposed on a conductive layer, the surface of the circuit board is covered with an organic insulating protective layer, the top surface of the metal bumps is exposed out of the organic insulating protective layer, and the top surface of the metal bumps is flush to the surface of the organic insulating protective layer; and an adhesive layer covering the top surface of the metal bumps that is exposed out of the organic insulating protective layer.

7. The conductive bump structure of a circuit board of claim 6, wherein the metal bumps are selected from at least one of copper, tin, silver, lead and their alloys.

8. The conductive bump structure of a circuit board of claim 6, wherein the adhesive layer is one selected from copper, tin, lead, silver, nickel, gold, platinum and their alloys.

9. A conductive bump structure of a circuit board, comprising:

metal bumps having a bulky structure formed on electrical connecting pads on the circuit board to cover a portion of the top surface of the electrical connecting pads, wherein the electrical connecting pads are disposed on a conductive layer, the surface of the circuit board is covered with an organic insulating protective layer, the top surface of the metal bumps is exposed out of the organic insulating protective layer, and the metal bumps are protruded from the surface of the organic insulating protective layer; and an adhesive layer covering the top surface and the sides of the metal bumps that is exposed out of the organic insulating protective layer.

10. The conductive bump structure of a circuit board of claim 9, wherein the metal bumps are selected from at least one of copper, tin, silver, lead and their alloys.

11. The conductive bump structure of a circuit board of claim 9, wherein the adhesive layer is one selected from copper, tin, lead, silver, nickel, gold, platinum and their alloys.

* * * * *